United States Patent
Shiokawa et al.

(10) Patent No.: US 10,522,742 B2
(45) Date of Patent: Dec. 31, 2019

(54) SPIN CURRENT MAGNETIZATION REVERSAL ELEMENT, MAGNETORESISTANCE EFFECT ELEMENT, AND MAGNETIC MEMORY

(71) Applicant: TDK CORPORATION, Tokyo (JP)

(72) Inventors: Yohei Shiokawa, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/778,577

(22) PCT Filed: Nov. 25, 2016

(86) PCT No.: PCT/JP2016/084976
§ 371 (c)(1),
(2) Date: May 23, 2018

(87) PCT Pub. No.: WO2017/090730
PCT Pub. Date: Jun. 1, 2017

(65) Prior Publication Data
US 2018/0351085 A1    Dec. 6, 2018

(30) Foreign Application Priority Data

Nov. 27, 2015  (JP) ................................ 2015-232334
Mar. 16, 2016  (JP) ................................ 2016-053072
(Continued)

(51) Int. Cl.
*H01L 43/08*  (2006.01)
*H01L 43/06*  (2006.01)
(Continued)

(52) U.S. Cl.
CPC ............ *H01L 43/06* (2013.01); *G01R 33/098* (2013.01); *G11C 11/161* (2013.01);
(Continued)

(58) Field of Classification Search
CPC .......... H01L 43/06; H01L 43/08; H01L 43/10; H01L 27/222; H01L 43/14; H01L 43/02; H01L 43/04
See application file for complete search history.

(56) References Cited

U.S. PATENT DOCUMENTS 4,785,241 A * 11/1988 Abiko .................... G01D 5/145
324/207.21
6,754,100 B1   6/2004 Hayakawa
(Continued)

FOREIGN PATENT DOCUMENTS

| JP | 2009194070 A | 8/2009 |
|----|--------------|--------|
| JP | 2014045196 A | 3/2014 |

(Continued)

OTHER PUBLICATIONS

I.M. Miron et al., "Perpendicular switching of a single ferromagnetic layer induced by in-plane current injection", Nature, 476, pp. 189-194, 2011.
(Continued)

*Primary Examiner* — Steven H Loke
*Assistant Examiner* — Samuel Park
(74) *Attorney, Agent, or Firm* — Oliff PLC

(57) ABSTRACT

A spin current magnetization reversal element includes: a first ferromagnetic metal layer with a changeable magnetization direction; and a spin-orbit torque wiring, wherein a first direction is perpendicular to a surface of the layer, the wiring extends in a second direction intersecting the first and is bonded to the layer, wherein the wiring material is a binary alloy represented by the formula $A_xB_{1-x}$, a metal carbide, or metal nitride, wherein A is selected from Al, Ti, and Pt, and B is selected from Al, Cr, Mn, Fe, Co, Ni, Y, Ru, Rh, and Ir and the material has a cubic structure with symmetry of a space group Pm-3m or Fd-3m; or A is selected from Al, Si, Ti, Y, and Ta, and B is selected from C,
(Continued)

N, Co, Pt, Au, and Bi and the material has a cubic structure with symmetry of a space group Fm-3m.

20 Claims, 2 Drawing Sheets

(30) Foreign Application Priority Data

| | | |
|---|---|---|
| Mar. 18, 2016 | (JP) | 2016-056058 |
| Oct. 27, 2016 | (JP) | 2016-210531 |
| Oct. 27, 2016 | (JP) | 2016-210533 |

(51) Int. Cl.

| | |
|---|---|
| G11C 11/16 | (2006.01) |
| H01L 27/22 | (2006.01) |
| H01L 43/02 | (2006.01) |
| H01L 43/10 | (2006.01) |
| H01L 43/14 | (2006.01) |
| G01R 33/09 | (2006.01) |
| H03B 15/00 | (2006.01) |

(52) U.S. Cl.
CPC ............ *H01L 27/222* (2013.01); *H01L 43/02* (2013.01); *H01L 43/08* (2013.01); *H01L 43/10* (2013.01); *H01L 43/14* (2013.01); *H03B 15/006* (2013.01)

(56) References Cited

U.S. PATENT DOCUMENTS

| | | |
|---|---|---|
| 9,218,864 B1 | 12/2015 | Yi et al. |
| 9,864,950 B2 | 1/2018 | Datta et al. |
| 9,953,692 B1 | 4/2018 | Mihajlovic et al. |
| 9,979,401 B2 | 5/2018 | Pan et al. |
| 10,211,394 B1 | 2/2019 | Inokuchi et al. |
| 10,229,723 B1 | 3/2019 | Choi et al. |
| 2002/0160234 A1* | 10/2002 | Sakawaki ............... G11B 5/66 428/832.1 |
| 2008/0316657 A1 | 12/2008 | Zhang et al. |
| 2009/0166773 A1 | 7/2009 | Ohno et al. |
| 2009/0201614 A1 | 8/2009 | Kudo et al. |
| 2010/0193888 A1 | 8/2010 | Gu et al. |
| 2010/0227050 A1* | 9/2010 | Kurokawa ............ C23C 14/564 427/131 |
| 2011/0169112 A1 | 7/2011 | Chen et al. |
| 2012/0250189 A1 | 10/2012 | Degawa et al. |
| 2013/0114334 A1 | 5/2013 | Yi et al. |
| 2014/0010004 A1 | 1/2014 | Suzuki |
| 2014/0056060 A1 | 2/2014 | Khvalkovskiy et al. |
| 2014/0124882 A1 | 5/2014 | Khalili Amid et al. |
| 2014/0269032 A1 | 9/2014 | Ong et al. |
| 2015/0036415 A1 | 2/2015 | Di Pendina et al. |
| 2015/0041934 A1 | 2/2015 | Khvalkovskiy et al. |
| 2015/0200003 A1 | 7/2015 | Buhrman et al. |
| 2015/0213867 A1 | 7/2015 | Wu et al. |
| 2015/0213869 A1 | 7/2015 | Wu et al. |
| 2015/0236247 A1 | 8/2015 | Behin-Aein et al. |
| 2016/0042778 A1 | 2/2016 | Manipatruni et al. |
| 2016/0247550 A1 | 8/2016 | Fukami et al. |
| 2016/0276006 A1 | 9/2016 | Ralph et al. |
| 2016/0300999 A1 | 10/2016 | Yi et al. |
| 2016/0380185 A1 | 12/2016 | Kato et al. |
| 2017/0125078 A1 | 5/2017 | Mihajlovic et al. |
| 2017/0249990 A1* | 8/2017 | Bauer ............... G11C 19/0825 |
| 2018/0277746 A1 | 9/2018 | Abe et al. |

FOREIGN PATENT DOCUMENTS

| | | |
|---|---|---|
| JP | 2014179618 A | 9/2014 |
| WO | 2013/025994 A2 | 2/2013 |
| WO | 2015/102739 A2 | 7/2015 |
| WO | 2015/137021 A1 | 9/2015 |

OTHER PUBLICATIONS

T. Kimura et al., "Estimation of spin-diffusion length from the magnitude of spin-current absorption: Multiterminal ferromagnetic/nonferromagnetic hybrid structures", Physical Review B72(1), pp. 014461-1-014461-6, 2005.

S. Takahashi et al., "Spin injection and detection in magnetic nanostructures", Physical Review B67(5), pp. 052409-1-052409-4, 2003.

J. Bass et al., "Spin-diffusion lengths in metals and alloys, and spin-flipping at metal/metal interfaces: an experimentalist's critical review", J. Physics Condensed Matter 19, pp. 1-50, 2007.

Y.K. Kato et al., "Observation of the Spin Hall Effect in Semiconductors", Science, 306, pp. 1910-1913, 2004.

L. Liu et al., "Spin torque switching with the giant spin Hall effect of tantalum", Science, vol. 336, pp. 1-18, and vol. 555, pp. 1-12, 2012.

L. Liu et al., "Current-Induced Switching of Perpendicularly Magnetized Magnetic Layers Using Spin Torque from the Spin Hall Effect", Physical Review Letters, 109, pp. 096602-1-096602-5, 2012.

KS. Lee et al., "Threshold current for switching of a perpendicular magnetic layer induced by spin Hall effect", Applied Physics Letters, 102, pp. 112410-1-112410-5, 2013.

KS. Lee et al., "Thermally activated switching of perpendicular magnet by spin-orbit spin torque", Applied Physics Letters, 104, pp. 072413-1-072413-5, 2014.

G. Yu et al, "Switching of perpendicular magnetization by spin-orbit torques in the absence of external magnetic fields", nature nanotechnology, 9, pp. 548-554, 2014.

S. Fukami et al., "Magnetization switching by spin-orbit torque in an antiferromagnet-ferromagnet bilayer system", nature materials, 15, pp. 535-542, 2016.

S. Fukami et al., "A spin-orbit torque switching scheme with collinear magnetic easy axis and current configuration", nature nanotechnology, 11, pp. 1-6, 2016.

M. Gradhand et al., "Spin Hall angle versus spin diffusion length: Tailored by impurities", Physical Review B, 81, pp. 245109-1-245109-5, 2010.

Feb. 7, 2017 International Search Report issued in Application No. PCT/JP2016/084968.

Feb. 7, 2017 International Search Report issued in Patent Application No. PCT/JP2016/085001.

Feb. 7, 2017 International Search Report issued in Patent Application No. PCT/JP2016/084976.

Feb. 14, 2017 International Search Report issued in Patent Application No. PCT/JP2016/084979.

Feb. 14, 2017 International Search Report issued in Patent Application No. PCT/JP2016/084974.

Feb. 7, 2017 International Search Report issued in Patent Application No. PCT/JP2016/084995.

U.S. Appl. No. 15/777,884, filed May 21, 2018 in the name of Sasaki et al.

U.S. Appl. No. 15/777,894, filed May 21, 2018 in the name of Sasaki.

U.S. Appl. No. 15/778,115, filed May 22, 2018 in the name of Shiokawa et al.

U.S. Appl. No. 15/778,159, filed May 22, 2018 in the name of Sasaki.

U.S. Appl. No. 15/778,174, filed May 22, 2018 in the name of Sasaki.

Apr. 10, 2019 Office Action issued in U.S. Appl. No. 15/777,894.
Apr. 26, 2019 Office Action issued in U.S. Appl. No. 15/778,115.
Mar. 22, 2019 Office Action issued in U.S. Appl. No. 15/777,884.
Sep. 18, 2019 Office Action issued in U.S. Appl. No. 15/778,159.

\* cited by examiner

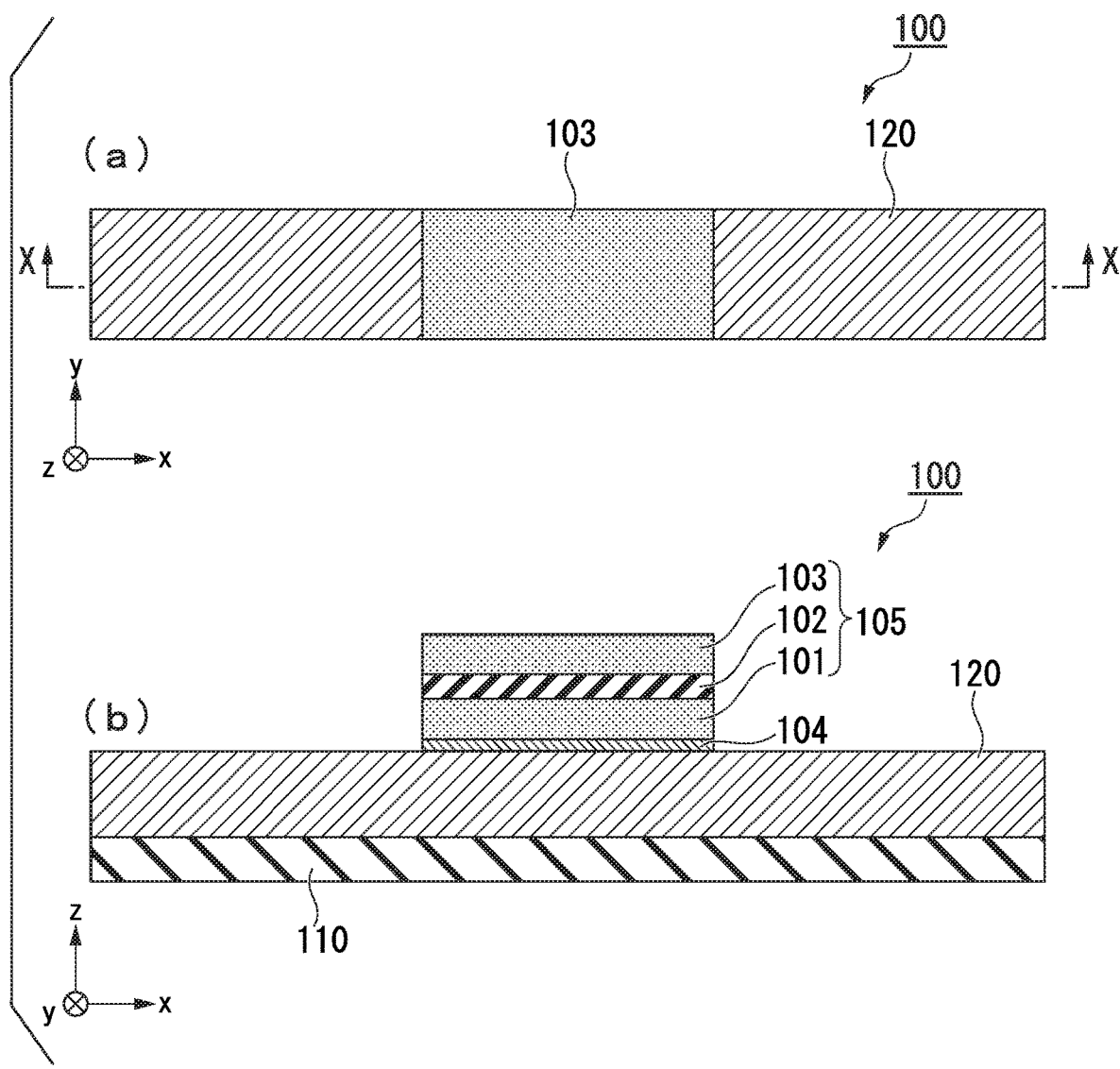

SPIN CURRENT MAGNETIZATION REVERSAL ELEMENT, MAGNETORESISTANCE EFFECT ELEMENT, AND MAGNETIC MEMORY

TECHNICAL FIELD

The present disclosure relates to a spin current magnetization reversal element, a magnetoresistance effect element, and a magnetic memory.

Priority is claimed on Japanese Patent Application No. 2015-232334 filed on Nov. 27, 2015, Japanese Patent Application No. 2016-53072 filed on Mar. 16, 2016, Japanese Patent Application No. 2016-56058 filed on Mar. 18, 2016, Japanese Patent Application No. 2016-210531 filed on Oct. 27, 2016, and Japanese Patent Application No. 2016-210533 filed on Oct. 27, 2016, the content of which is incorporated herein by reference.

BACKGROUND ART

A giant magnetoresistance (GMR) element formed by a multi-layer film including a ferromagnetic layer and a non-magnetic layer and a tunneling magnetoresistance (TMR) element using an insulating layer (a tunnel barrier layer, a barrier layer) as a non-magnetic layer are known. In general, the TMR element has a higher element resistance than the GMR element, but the TMR element has a higher magnetoresistance (MR) ratio than the GMR element. For that reason, the TMR element has gained attention as elements for magnetic sensors, high-frequency components, magnetic heads, and non-volatile random access memories (MRAM).

The MRAM reads and writes data by using a characteristic in which the element resistance of the TMR element changes when the mutual magnetization directions of two ferromagnetic layers sandwiching an insulating layer change. As a writing method of the MRAM, a method of performing writing (magnetization reversal) by using a magnetic field caused by a current and a method of performing writing (magnetization reversal) by using a spin transfer torque (STT), which is generated by a current flowing in a lamination direction of the magnetoresistance element, have been known. The magnetization reversal of the TMR element using STT is efficient from the viewpoint of energy efficiency, but a reversal current density for the magnetization reversal is high. From the viewpoint of the long lifetime of the TMR element, it is desirable that the reversal current density be low. The same applies to the GMR element.

In recent years, as a means for reducing the reversal current by a mechanism different from the STT, magnetization reversal using a pure spin current generated by a spin hall effect has gained attention (for example, see Non-Patent Document 1). The pure spin current generated by the spin hall effect induces a spin-orbit torque (SOT) and magnetization reversal occurs by the SOT. Alternatively, even in the pure spin current caused by the Rashba effect at an interface of different materials, the magnetization reversal is caused by the same SOT. The pure spin current is generated when the same number of upward spin electrons and downward spin electrons flows in the opposite directions and the flows of electric charges are cancelled. For that reason, since the current flowing in the magnetoresistance effect element is zero, there has been an expectation of realizing the magnetoresistance effect element having a small reversal current density.

The spin hall effect is dependent on the magnitude of the spin-orbit interaction. In Non-Patent Document 2, Ta which is heavy metal having d electrons causing a spin-orbit interaction is used in the spin-orbit torque wiring. Further, it is known that spin-orbit interaction occurs due to an electric field inside a crystal caused by the collapse of spatial inversion symmetry in GaAs which is a semiconductor.

CITATION LIST

Non-Patent Literature

Non-Patent Document 1: I. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189 (2011).

Non-Patent Document 2: S. Fukami, T. Anekawa, C. Zhang, and H. Ohno, Nature Nanotechnology, DOI: 10.1038/NNANO. 2016. 29.

SUMMARY OF INVENTION

Problems to be Solved by the Invention

In Non-Patent Document 2, it is reported that the reversal current density (hereinafter, referred to as a "SOT reversal current density") caused by the SOT is the same as the reversal current density caused by the STT. In order to further reduce the reversal current density caused by the SOT, there is a need to use a material causing a high spin hall effect, that is, a material having a high pure spin current generation efficiency.

The present disclosure is made in view of the above-described problems and an object of the present disclosure is to provide a spin current magnetization reversal element, a magnetoresistance effect element, and a magnetic memory, which are capable of performing magnetization reversal by a pure spin current at a low reversal current density compared to the related art.

Means for Solving the Problems

Although the cause of the SOT is not clearly proved yet, an internal factor and an external factor are roughly considered.

The internal factor is caused by the material itself constituting the spin-orbit torque wiring. For example, examples of the internal factor include the type of material used for the spin-orbit torque wiring and a crystal structure of the spin-orbit torque wiring.

Meanwhile, the external factor is caused by an external action and is a factor other than the internal factor. For example, examples of the external factor include scattering factors such as impurities contained in the spin-orbit torque wiring and the interface provided between the spin-orbit torque wiring and other layers.

The inventors focused on the SOT caused by the crystal structure of the spin-orbit torque wiring among various reasons. Conventionally, a single heavy metal has been used as a material for the spin-orbit torque wiring. This is because a simple material is suitable for explaining a physical phenomenon which is called SOT. On the contrary, the inventors examined the effect of SOT in a wide range of combinations mainly on alloys having a crystal structure with collapsed inversion symmetry. This is because a large SOT effect can be expected by an internal field which is caused by the collapse of the symmetry of the crystal structure in such a material. Then, a prescribed material which exhibits an SOT reversal current density lower by about two digits of magnitude than the single SOT reversal current density of the related art was discovered, and the present disclosure was contrived.

The present disclosure provides the following means to solve the above-described problems.

(1) A spin current magnetization reversal element according to an aspect of the present disclosure includes: a first ferromagnetic metal layer with a changeable magnetization direction; and a spin-orbit torque wiring, wherein a first direction is defined as a direction perpendicular to a surface of the first ferromagnetic metal layer, the spin-orbit torque wiring extends in a second direction intersecting the first direction, and the spin-orbit torque wiring is bonded to the first ferromagnetic metal layer, wherein a material of the spin-orbit torque wiring is a binary alloy represented by the formula $A_xB_{1-x}$ a metal carbide, or a metal nitride, wherein A is an element selected from a group consisting of Al, Ti, and Pt, and B is an element selected from a group consisting of Al, Cr, Mn, Fe, Co, Ni, Y, Ru, Rh, and Ir and the material has a cubic structure with symmetry of a space group Pm-3m or Fd-3m; or A is an element selected from a group consisting of Al, Si, Ti, Y, and Ta, and B is an element selected from a group consisting of C, N, Co, Pt, Au, and Bi and the material has a cubic structure with symmetry of a space group Fm-3m.

(2) In the spin current magnetization reversal element according to (1), the material may be one selected from a group consisting of $Al_xFe_{1-x}$, $Al_xCo_{1-x}$, $Al_xNi_{1-x}$, $Al_xRu_{1-x}$, $Al_xRh_{1-x}$, $Al_xIr_{1-x}$, $Ti_xFe_{1-x}$, $Ti_xCo_{1-x}$, and $Ti_xNi_{1-x}$, which have a structure of CsCl.

(3) In the spin current magnetization reversal element according to (1), the material may be one selected from a group consisting of $Ti_xFe_{1-x}$, $Ti_xCo_{1-x}$, and $Ti_xNi_{1-x}$, which have a structure of $Ti_2Ni$.

(4) In the spin current magnetization reversal element according to (1), the material may be one selected from a group consisting of $Pt_xAl_{1-x}$, $Pt_xCr_{1-x}$, $Pt_xMn_{1-x}$, $Pt_xFe_{1-x}$, and $Pt_xY_{1-x}$, which have a structure of $Cu_3Au$.

(5) In the spin current magnetization reversal element according to (1), the material may be one selected from a group consisting of $Al_xN_{1-x}$, $Ti_xC_{1-x}$, $Ti_xN_{1-x}$, $Y_xBi_{1-x}$, and $Ta_xN_{1-x}$, which have a structure of NaCl.

(6) In the spin current magnetization reversal element according to (1), the material may be one selected from a group consisting of $Al_xFe_{1-x}$, $Si_xMn_{1-x}$, and $Si_xFe_{1-x}$, which have a structure of $BiF_3$.

(7) In the spin current magnetization reversal element according to (1), the material may be one selected from a group consisting of $Al_xPt_{1-x}$, $Al_xAu_{1-x}$, and $Al_xCo_{1-x}$, which have a structure of $CaF_2$.

(8) A magnetoresistance effect element according to an aspect of the present disclosure includes: the spin current magnetization reversal element according to any one of (1) to (7); a second ferromagnetic metal layer with a fixed magnetization direction; and a non-magnetic layer which is sandwiched between the first ferromagnetic metal layer and the second ferromagnetic metal layer.

(9) A magnetic memory according to an aspect of the present disclosure includes a plurality of the magnetoresistance effect elements according to (8).

Advantageous Effects of Invention

According to the spin current magnetization reversal element of the present disclosure, it is possible to provide a spin current magnetization reversal element capable of performing magnetization reversal by a pure spin current at a low reversal current density compared to the related art.

BRIEF DESCRIPTION OF DRAWINGS

FIG. 1(a) is a plan view and FIG. 1(b) is a cross-sectional view.

FIG. 3 is a schematic diagram showing an embodiment of the magnetoresistance effect element according to the present disclosure, where FIG. 3(a) is a plan view and FIG. 3(b) is a cross-sectional view.

BEST MODE FOR CARRYING OUT THE INVENTION

Hereinafter, the present disclosure will be described in detail with reference to the appropriate drawings. In the diagrams used in the following description, a featured part may be enlarged for convenience of description to easily understand the features of the present disclosure and the dimensional ratios of the components may be different from actual ratios. The materials, dimensions and the like in the following description are merely exemplary examples and the present disclosure is not limited to these examples. Various modifications may be appropriately made in a range where the effect of the present disclosure can be achieved. The element of the present disclosure may include other layers in so far as the effect of the present disclosure is obtained.

(Spin Current Magnetization Inversion Element)

Figure 1:
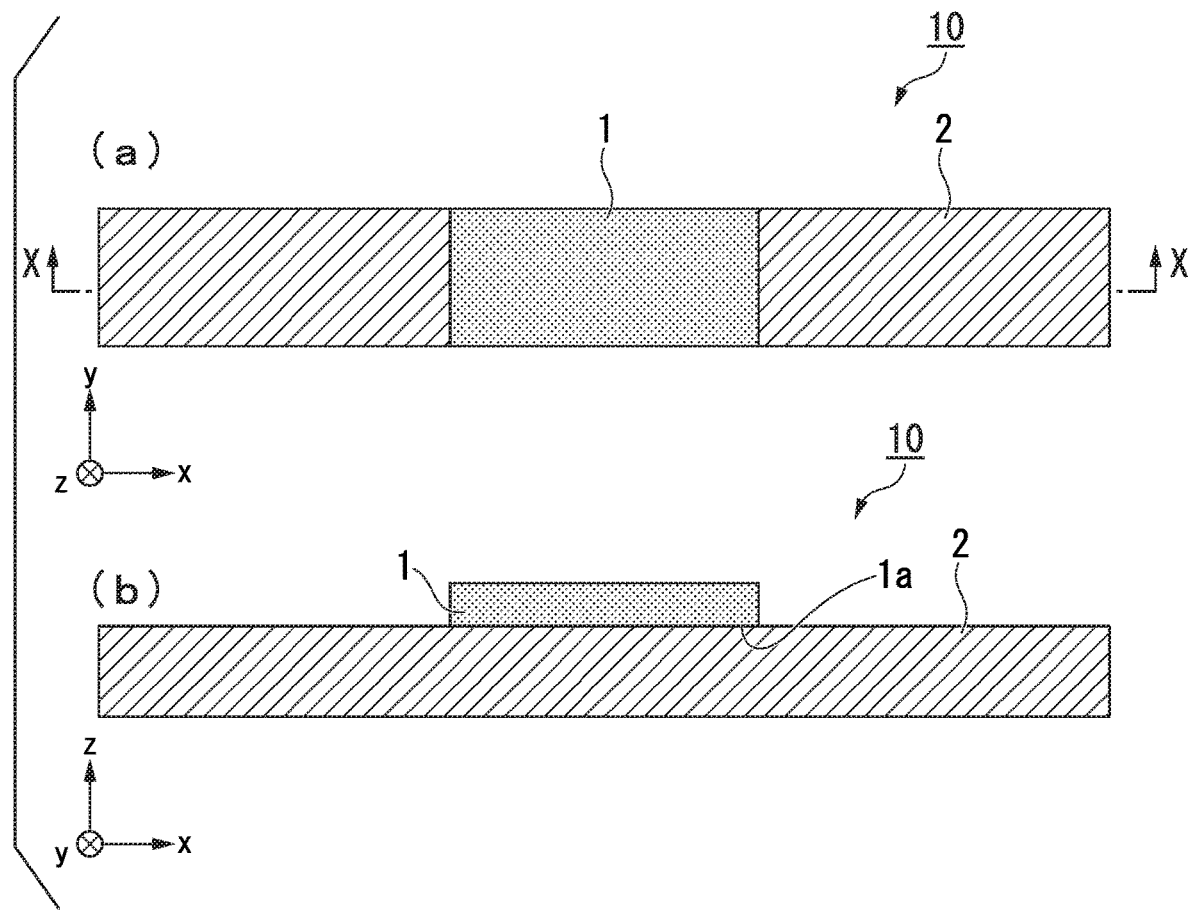
FIG. 1 is a schematic diagram showing an embodiment of a spin current magnetization reversal element of the present disclosure, where

FIG. 1 is a schematic diagram showing an example of a spin current magnetization reversal element according to an embodiment of the present disclosure. FIG. 1(a) is a plan view and FIG. 1(b) is a cross-sectional view taken along a line X-X which is a center line of a spin-orbit torque wiring 2 of FIG. 1(a) in the width direction.

A spin current magnetization reversal element 10 shown in FIG. 1 includes a first ferromagnetic metal layer 1 with a changeable magnetization direction and a spin-orbit torque wiring 2 which extends in a second direction (x direction), which is a direction perpendicular to the surface of the first ferromagnetic metal layer 1, and is bonded to a first surface 1a of the first ferromagnetic metal layer 1. The material of the spin-orbit torque wire 2 is a binary alloy represented by the formula $A_xB_{1-x}$, a metal carbide, or a metal nitride, where A is an element selected from a group consisting of Al, Ti, and Pt and B is an element selected from a group consisting of Al, Cr, Mn, Fe, Co, Ni, Y, Ru, Rh, and Ir, and the material has a cubic structure with symmetry of a space group Pm-3m or Fd-3m. Alternatively, A is an element selected from a group consisting of Al, Si, Ti, Y, and Ta and B is an element selected from a group consisting of C, N, Co, Pt, Au, and Bi, and the material has a cubic structure with symmetry of a space group Fm-3m.

The inventors of the present disclosure determined a material search policy, such that a binary alloy is mainly searched for the spin-orbit torque wiring, materials are searched to break rotational symmetry by mixing heavy metals with good cubic crystal rotation symmetry as host metal and light elements as heterogeneous substitution metals causing asymmetry, and materials are searched which have good lattice matching with Fe which is mainly used as the material of the first ferromagnetic metal layer in order to obtain a high magnetoresistance effect. It should be noted that in the material of the spin-orbit torque wiring, the substitution material to be mixed with the host material is not an impurity but a material constituting the crystal. However, the material of the spin-orbit torque wiring may contain inevitable impurities inevitably included in raw materials or inevitably mixed in the manufacturing process.

When A is Al and B is Al, the material is not a binary alloy, metal carbide, or metal nitride. In this case, the material is not included in the present disclosure.

Hereinafter, a direction which is perpendicular to the surface of the first ferromagnetic metal layer 1 or a direction in which the first ferromagnetic metal layer 1 and the spin-orbit torque wiring 2 are laminated will be set as the z direction (a first direction), a direction (a second direction) which is perpendicular to the z direction and is parallel to the spin-orbit torque wiring 2 will be set as the x direction, and a direction (a third direction) which is orthogonal to the x direction and the z direction will be set as the y direction.

In the following description including FIG. 1, a case of a configuration in which the spin-orbit torque wiring extends in a direction orthogonal to the first direction will be described as an example of a configuration in which the spin-orbit torque wiring extends in a direction intersecting the first direction which is a direction perpendicular to the surface of the first ferromagnetic metal layer.

A spin-orbit interaction occurs more strongly in materials with lower spatial inversion symmetry. Therefore, in the case of a material which is a predetermined binary alloy, metal carbide, or metal nitride in the cubic crystal structure belonging to the space group of Pm-3m, Fd-3m, or Fm-3m of the present disclosure, even if the crystals have good symmetry, the reversal symmetry collapses due to the difference between the two kinds of materials and hence a high spin-orbit interaction can be caused.

<Spin-orbit Torque Wiring>

The spin-orbit torque wiring 2 is provided to perform magnetization reversal using the spin-orbit torque (SOT) and when a current flows therethrough, a pure spin current is generated therein by a spin hall effect.

The spin hall effect is a phenomenon in which a pure spin current is induced in a direction orthogonal to a direction of a current based on a spin-orbit interaction when a current flows to a material.

Figure 2:
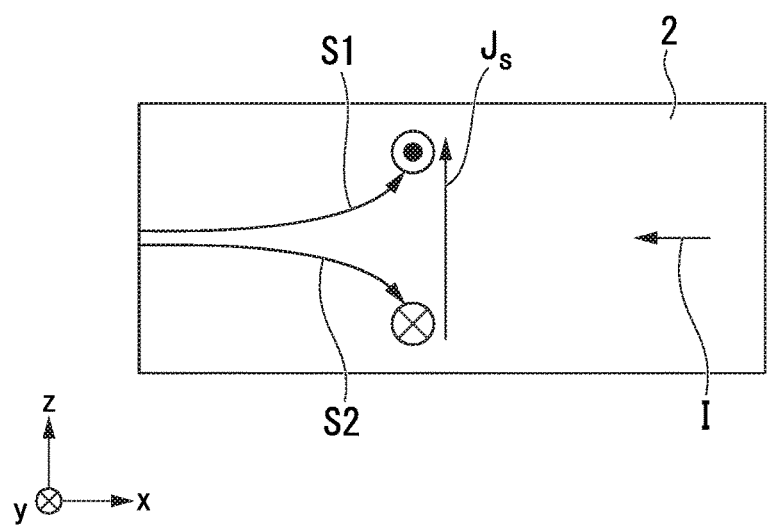
FIG. 2 is a schematic diagram showing a spin hall effect.

FIG. 2 is a schematic diagram showing the spin hall effect. FIG. 2 is a cross-sectional view when the spin-orbit torque wiring 2 shown in FIG. 1 is cut along the x direction. Referring to FIG. 2, a mechanism in which the pure spin current is generated by the spin hall effect will be described.

As shown in FIG. 2, when a current 1 flows in the extension direction of the spin-orbit torque wiring 2, a first spin S1 oriented toward the front side of the paper and a second spin S2 oriented toward the rear side of the paper can be respectively bent in a direction orthogonal to the current. The ordinary hall effect and the spin hall effect are common in that the motion (movement) direction of the charge (electron) that acts (moves) is bent. However, there is a big difference in that the ordinary hall effect has a feature that the movement direction of the charged particles moving in the magnetic field can be bent by the Lorentz force, and the spin hall effect has a feature that the movement direction can be bent only by electron movement (current flows) even though there is no magnetic field.

In a non-magnetic material (a material other than the ferromagnetic material), since the number of electrons of the first spin S1 is the same as the number of electrons of the second spin S2, the number of electrons of the first spin S1 directed upward in the drawing is the same as the number of electrons of the second spin S2 directed downward. For that reason, the current flowing as a net charge flow is zero. The spin current without electric current is particularly called a pure spin current.

When the current flows in the ferromagnetic material, the first spin S1 and the second spin S2 are bent in the opposite direction in the same way. Meanwhile, in the ferromagnetic material, one of the first spin S1 and the second spin S2 is large, and as a result, a net charge flow will occur (a voltage occurs). Thus, as the material of the spin-orbit torque wiring 2, a material only including the ferromagnetic material is not included.

Here, when the flow of electrons of the first spin S1 is indicated by $J\uparrow$, the flow of electrons of the second spin S2 is indicated by $J\downarrow$, and the spin current is indicated by $J_s$ it is defined as $J_s=J\uparrow-J\downarrow$. In FIG. 2, $J_s$ corresponding to the pure spin current flows upward in the drawing. Here, $J_s$ indicates the flow of electrons having a polarization ratio of 100%.

In FIG. 1, when a ferromagnetic material is brought into contact with the top surface of the spin-orbit torque wiring 2, the pure spin current flows into the ferromagnetic material to be diffused therein. That is, the spin is injected into the first ferromagnetic metal layer 1. Here, the spin-orbit torque wiring 2 and the first ferromagnetic metal layer 1 may be bonded to each other "directly" or bonded to each other "through other layer". As long as a pure spin current generated in the spin-orbit torque wiring flows to the first ferromagnetic metal layer, a method of bonding (connecting or coupling) the spin-orbit torque wiring and the first ferromagnetic metal layer to each other is not limited.

As the material constituting the spin-orbit torque wiring 2, one selected from a group consisting of $Al_xFe_{1-x}$, $Al_xCo_{1-x}$, $Al_xNi_{1-x}$, $Al_xRu_{1-x}$, $Al_xRh_{1-x}$, $Al_xIr_{1-x}$, $Ti_xFe_{1-x}$, $Ti_xCo_{1-x}$, and $Ti_xNi_{1-x}$, which have the structure of CsCl, can be used.

Since the spin-orbit torque wiring 2 is formed of these materials, a high spin-orbit interaction can be caused.

Further, since these materials have a lattice mismatch of 5% or less with the ferromagnetic metal layer of Fe or the like to be bonded, a high magnetoresistance ratio is maintained.

As the material constituting the spin-orbit torque wiring 2, one selected from the group consisting of $Ti_xFe_{1-x}$, $Ti_xCo_{1-x}$, and $Ti_xNi_{1-x}$, which have the structure of $Ti_2Ni$, can be used.

Since the spin-orbit torque wiring 2 is formed of these materials, a high spin-orbit interaction can be caused.

Further, since these materials have a lattice mismatch of 5% or less with the ferromagnetic metal layer of Fe or the like to be bonded, a high magnetoresistance ratio is maintained.

As the material constituting the spin-orbit torque wiring 2, one selected from the group consisting of $Pt_xAl_{1-x}$, $Pt_xCr_{1-x}$, $Pt_xMn_{1-x}$, $Pt_xFe_{1-x}$, and $Pt_xY_{1-x}$, which have the structure of $Cu_3Au$, can be used.

Since the spin-orbit torque wiring 2 is formed of these materials, a high spin-orbit interaction can be caused.

Further, since these materials have a lattice mismatch of 5% or less with the ferromagnetic metal layer of Fe or the like to be bonded, a high magnetoresistance ratio is maintained.

As the material constituting the spin-orbit torque wiring 2, one selected from the group consisting of $Al_xN_{1-x}$, $Ti_xC_{1-x}$, $Ti_xN_{1-x}$, $Y_xBi_{1-x}$, and $Ta_xN_{1-x}$, which have the structure of NaCl, can be used.

Since the spin-orbit torque wiring 2 is formed of these materials, a high spin-orbit interaction can be caused.

Further, since these materials have a lattice mismatch of 5% or less with the ferromagnetic metal layer of Fe or the like to be bonded, a high magnetoresistance ratio is maintained.

As the material constituting the spin-orbit torque wiring 2, one selected from the group consisting of $Al_xFe_{1-x}$, $Si_xMn_{1-x}$, and $Si_xFe_{1-x}$, which have the structure of $BiF_3$, can be used.

Since the spin-orbit torque wiring 2 is formed of these materials, a high spin-orbit interaction can be caused.

Further, since these materials have a lattice mismatch of 5% or less with the ferromagnetic metal layer of Fe or the like to be bonded, a high magnetoresistance ratio is maintained.

As the material constituting the spin-orbit torque wiring 2, one selected from the group consisting of $Al_xPt_{1-x}$, $Al_xAu_{1-x}$, and $Al_xCo_{1-x}$, which have the structure of $CaF_2$, can be used.

Since the spin-orbit torque wiring 2 is formed of these materials, a high spin-orbit interaction can be caused.

Further, since these materials have a lattice mismatch of 5% or less with the ferromagnetic metal layer of Fe or the like to be bonded, a high magnetoresistance ratio is maintained.

<First Ferromagnetic Metal Layer>

In the spin current magnetization reversal element shown in FIG. 1, the first ferromagnetic metal layer may be an in-plane magnetization film of which a magnetization direction is an in-plane direction parallel to the layer, or a perpendicular magnetization film of which a magnetization direction is perpendicular to the layer.

In the spin current magnetization reversal element shown in FIG. 1, the first ferromagnetic metal layer has a shape anisotropy having an elongated axis in the second direction which is the extending direction of the spin-orbit torque wiring in a plan view.

Since the first ferromagnetic metal layer is narrow and elongated in this way, the magnetization is easily reversed in this direction and hence the reversal current density can also be small accordingly.

In the spin current magnetization reversal element shown in FIG. 1, the first ferromagnetic metal layer has a square shape (more accurately, a rectangular shape) when viewed from above in the z direction, but may have an elliptical shape or other shapes.

The first ferromagnetic metal layer will be described later.

Hereinafter, the magnetoresistance effect element using the spin current magnetization reversal element will be described, but the application of the spin current magnetization reversal element is not limited to the magnetoresistance effect element. As another application, for example, the spin current magnetization reversal element can also be used in a spatial light modulator in which the spin current magnetization reversal element is disposed at each pixel and spatially modulates the incident light by utilizing the magneto-optical effect. In order to avoid the hysteresis effect caused by the coercivity of the magnet in the magnetic sensor, a magnetic field to be applied to the magnetization easy axis of the magnet may be replaced by SOT.

(Magnetoresistance Effect Element)

The magnetoresistance effect element according to the embodiment of the present disclosure includes the spin current magnetization reversal element of the present disclosure, the second ferromagnetic metal layer of which the magnetization direction is fixed, and the non-magnetic layer sandwiched between the first ferromagnetic metal layer and the second ferromagnetic metal layer.

FIG. 3 is a diagram showing an application example of the spin current magnetization reversal element of the present disclosure and is a schematic diagram showing an example of a magnetoresistance effect element which is also the magnetoresistance effect element according to the embodiment of the present disclosure. FIG. 3(a) is a plan view and FIG. 3(b) is a cross-sectional view taken along a line X-X which is a center line of the spin-orbit torque wiring 2 of FIG. 3(a) in the width direction.

A magnetoresistance effect element 100 shown in FIG. 3 includes the spin current magnetization reversal element (a first ferromagnetic metal layer 101 and a spin-orbit torque wiring 120) of the present disclosure, a second ferromagnetic metal layer 103 with a fixed magnetization direction, and a non-magnetic layer 102 which is sandwiched between the first ferromagnetic metal layer 101 and the second ferromagnetic metal layer 103. Further, it can be said that the magnetoresistance effect element 100 shown in FIG. 3 includes a magnetoresistance effect element portion 105 and the spin-orbit torque wiring 120.

FIG. 3 also shows a substrate 110 for manufacturing the magnetoresistance effect element 100.

Since the magnetoresistance effect element according to the embodiment of the present disclosure includes the spin-orbit torque wiring 120, it is possible to use a structure wherein the magnetization reversal of the magnetoresistance effect element is performed only by SOT using the pure spin current (hereinafter, referred to as a configuration only using "SOT"), and to use a structure wherein SOT of the pure spin current is used together in the magnetoresistance effect element using STT of the related art (hereinafter, referred to as a configuration using "both STT and SOT"). Additionally, when the STT is used, a wiring for the current flowing in the lamination direction of the magnetoresistance effect element 100 is necessary.

In the following description including FIG. 3, as an example of a configuration in which the spin-orbit torque wiring extends in a direction intersecting the lamination direction of the magnetoresistance effect element portion, a case of a configuration in which the wiring extends in the orthogonal direction will be described.

<Magnetoresistance Effect Element Portion>

The magnetoresistance effect element portion 105 includes the second ferromagnetic metal layer 103 of which the magnetization direction is fixed, the first ferromagnetic metal layer 101 of which the magnetization direction can change, and the non-magnetic layer 102 which is sandwiched between the second ferromagnetic metal layer 103 and the first ferromagnetic metal layer 101.

Since the magnetization of the second ferromagnetic metal layer 103 is fixed in one direction and the magnetization direction of the first ferromagnetic metal layer 101 relatively changes, a function as the magnetoresistance effect element portion 105 is exhibited. In the case of applying to a coercivity-differed type (pseudo spin valve type) MRAM, the holding force of the second ferromagnetic metal layer is larger than the coercivity of the first ferromagnetic metal layer. Further, in the case of applying to an exchange bias type (spin valve type) MRAM, the magnetization direction of the second ferromagnetic metal layer is fixed due to the exchange coupling with the antiferromagnetic layer.

Further, the magnetoresistance effect element portion 105 is a TMR (Tunneling Magnetoresistance) element when the non-magnetic layer 102 is formed as an insulator, and is a GMR (Giant Magnetoresistance) element when the non-magnetic layer 102 is formed of metal.

As the magnetoresistance effect element portion of the present disclosure, a configuration of a known magnetoresistance effect element portion can be used. For example, each layer may consists of a plurality of layers, and each layer may include other layers such as an antiferromagnetic layer for fixing the magnetization direction of the second ferromagnetic metal layer.

The second ferromagnetic metal layer 103 is called a magnetization fixed layer or a reference layer, and the first ferromagnetic metal layer 101 is called a magnetization free layer or a recording layer.

The second ferromagnetic metal layer 103 and the first ferromagnetic metal layer 101 may be an in-plane magnetization film of which a magnetization direction is an in-plane direction parallel to the layer or a perpendicular magnetization film of which a magnetization direction is a direction perpendicular to the layer.

As the material of the second ferromagnetic metal layer 103, a known material can be used. For example, a metal selected from a group consisting of Cr, Mn, Co, Fe, and Ni and alloy exhibiting ferromagnetism and containing at least one of these metals can be used. Alloy containing these metals and at least one element of B, C, and N can be also used. Specifically, Co—Fe and Co—Fe—B are exemplary examples.

In order to obtain a higher output, it is desirable to use Heusler alloy such as $Co_2FeSi$. The Heusler alloy contains an intermetallic compound having a chemical composition of $X_2YZ$, where X indicates a transition metal element or a noble metal element of Co, Fe, Ni, or Cu group on the periodic table, Y indicates transition metal of Mn, V, Cr, or Ti group and can be element species of X, and Z indicates a typical element of group III to group V. For example, $Co_2FeSi$, $Co_2MnSi$, $Co_2Mn_{1-a}Fe_aAl_bSi_{1-b}$, and the like are exemplary examples.

Further, an antiferromagnetic material such as IrMn or PtMn may be used as a material in contact with the second ferromagnetic metal layer 103 in order to further increase the coercivity of the second ferromagnetic metal layer 103 with respect to the first ferromagnetic metal layer 101. In addition, in order to prevent the leakage magnetic field of the second ferromagnetic metal layer 103 from affecting the first ferromagnetic metal layer 101, a synthetic ferromagnetic coupling structure may be adopted.

Furthermore, when the magnetization direction of the second ferromagnetic metal layer 103 is made perpendicular to the laminated surface, it is desirable to use a laminated film of Co and Pt. Specifically, the second ferromagnetic metal layer 103 may have a structure of [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm).

As the material of the first ferromagnetic metal layer 101, a ferromagnetic material can be applied, and a soft magnetic material can be particularly preferably applied. For example, metal selected from a group consisting of Cr, Mn, Co, Fe, and Ni, alloy containing at least one of these metals, and alloy containing these metals and at least one element of B, C, and N can be used. Specifically, Co—Fe, Co—Fe—B, or Ni—Fe are exemplary examples.

When the magnetization direction of the first ferromagnetic metal layer 101 is made perpendicular to the lamination surface, it is desirable to set the thickness of the first ferromagnetic metal layer to 2.5 nm or less. It is possible to apply perpendicular magnetic anisotropy to the first ferromagnetic metal layer 101 at the interface between the first ferromagnetic metal layer 101 and the non-magnetic layer 102. Further, since the effect of the perpendicular magnetic anisotropy is attenuated when the film thickness of the first ferromagnetic metal layer 101 is thickened, it is desirable to decrease the film thickness of the first ferromagnetic metal layer 101.

A known material can be used in the non-magnetic layer 102.

For example, when the non-magnetic layer 102 is formed as an insulator (that is, formed as a tunnel barrier layer), $Al_2O_3$, $SiO_2$, MgO, $MgAl_2O_4$ and the like can be used as the material thereof. In addition, a material in which a part of Al, Si, and Mg is substituted by Zn, Be, and the like can be also used. Among these, since MgO or $MgAl_2O_4$ is a material that can realize coherent tunneling, the spin can be efficiently injected.

Further, when the non-magnetic layer 102 is formed of metal, Cu, Au, Ag, and the like can be used as the material thereof.

Further, as shown in FIG. 3, it is desirable that the cap layer 104 be preferably formed on a surface of the first ferromagnetic metal layer 101, wherein the surface is opposite to the other surface which contacts with the non-magnetic layer 102. The cap layer 104 can suppress the diffusion of elements from the first ferromagnetic metal layer 101. Further, the cap layer 104 also contributes to the crystal orientation of each layer of the magnetoresistance effect element portion 105. As a result, when the cap layer 104 is provided, the magnetism of the first ferromagnetic metal layer 101 and the second ferromagnetic metal layer 103 of the magnetoresistance effect element portion 105 is stabilized and hence the resistance of the magnetoresistance effect element portion 105 can be decreased.

It is desirable to use a material with high conductivity for the cap layer 104. For example, Ru, Ta, Cu, Ag, Au, and the like can be used. The crystal structure of the cap layer 104 is desirably set appropriately from the fcc structure, the hcp structure, or the bcc structure according to the crystal structure of the adjacent ferromagnetic metal layer.

Further, it is desirable to use any one selected from a group consisting of silver, copper, magnesium, and aluminum for the cap layer 104. Although it will be described later in detail, when the spin-orbit torque wiring 120 and the magnetoresistance effect element portion 105 are connected to each other through the cap layer 104, it is desirable that the cap layer 104 prevent the dissipating of the spin transmitted from the spin-orbit torque wiring 120. It is known that silver, copper, magnesium, aluminum, and the like have a long spin diffusion length of 100 nm or more, and the spin hardly dissipates.

It is desirable that the thickness of the cap layer 104 be equal to or smaller than the spin diffusion length of the material constituting the cap layer 104. When the thickness of the cap layer 104 is equal to or smaller than the spin diffusion length, the spin transmitted from the spin-orbit torque wiring 120 can be sufficiently transmitted to the magnetoresistance effect element portion 105.

<Substrate>

It is desirable that the substrate 110 have high flatness. In order to obtain a surface having high flatness, for example, Si, AlTiC, and the like can be used as a material thereof.

An underlayer (not shown) may be formed on a surface of the substrate 110, wherein the surface is on the side of the spin-orbit torque wiring 120. When the underlayer is provided, it is possible to control the crystallinity such as the crystal orientation and a crystal grain size of each layer including the spin-orbit torque wiring 120 laminated on the substrate 110.

It is desirable that the underlayer have an insulation property. This countermeasure is for preventing the current flowing in the spin-orbit torque wiring 120 and the like from dissipating. Various materials can be used for the underlayer.

For example, as one example, a nitride layer having a (001)-oriented NaCl structure and containing at least one element selected from a group of Ti, Zr, Nb, V, Hf, Ta, Mo, W, B, Al, and Ce can be used for the underlayer.

As another example, a layer of (002)-oriented perovskite-based conductive oxide represented by a composition formula of $XYO_3$ can be used for the underlayer. Here, the site X contains at least one element selected from a group of Sr, Ce, Dy, La, K, Ca, Na, Pb, and Ba and the site Y contains at least one element selected from a group of Ti, V, Cr, Mn, Fe, Co, Ni, Ga, Nb, Mo, Ru, Ir, Ta, Ce, and Pb.

As another example, a layer of an oxide having a (001)-oriented NaCl structure and containing at least one element selected from a group of Mg, Al, and Ce can be used for the underlayer.

As another example, a layer having a (001)-oriented tetragonal structure or a cubic crystal structure and containing at least one element selected from a group of Al, Cr, Fe, Co, Rh, Pd, Ag, Ir, Pt, Au, Mo, and W can be used for the underlayer.

Further, the underlayer is not limited to a single layer and may be obtained by laminating a plurality of layers in the above-described example. By studying the structure of the underlayer, the crystallinity of each layer of the magnetoresistance effect element portion 105 can be enhanced and the magnetic characteristics can be improved.

<Upper Wiring>

An upper wiring (not shown) may be provided on a surface (an upper surface in FIG. 3) of the second ferromagnetic metal layer 103, wherein the surface is opposite to the other surface where the non-magnetic layer 102 is provided.

The upper wiring is electrically connected to the second ferromagnetic metal layer 103 of the magnetoresistance effect element portion 105, a closed circuit is formed by the upper wiring, the spin-orbit torque wiring 120, and a power supply (not shown), and a current flows in the lamination direction of the magnetoresistance effect element portion 105.

The material of the upper wiring is not particularly limited as long as the wiring has high conductivity. For example, aluminum, silver, copper, gold, and the like can be used.

In the case of a configuration using both "STT and SOT", two power supplies including a first power supply and a second power supply may be used.

The first power supply is connected to the upper wiring and the spin-orbit torque wiring 120. The first power supply can control a current flowing in the lamination direction of the magnetoresistance effect element portion 105.

The second power supply 150 is connected to both ends of the spin-orbit torque wiring 120. The second power supply 150 can control a current flowing in the spin-orbit torque wiring 120, wherein the current flows in a direction orthogonal to the lamination direction of the magnetoresistance effect element portion 105.

As described above, the current flowing in the lamination direction of the magnetoresistance effect element portion 105 induces STT. On the contrary, the current flowing in the spin-orbit torque wiring 120 induces SOT. Both STT and SOT contribute to the magnetization reversal of the first ferromagnetic metal layer 101.

In this way, when the amount of the current flowing in the lamination direction of the magnetoresistance effect element portion 105 and the current flowing in a direction orthogonal to the lamination direction is controlled by two power supplies, it is possible to freely control the contribution rate at which SOT and STT contribute to the magnetization reversal.

For example, when a large current cannot flow to the device, a control may be performed such that STT having high energy efficiency for the magnetization reversal is mainly used. That is, the amount of the current flowing from the first power supply can be increased and the amount of the current flowing from the second power supply can be decreased.

Further, for example, when a thin device needs to be manufactured and the non-magnetic layer 102 has to be thin, a current flowing in the non-magnetic layer 102 should be small. In this case, the amount of the current flowing from the first power supply is decreased and the amount of the current flowing from the second power supply is increased to increase the contribution rate of SOT.

As the first power supply and the second power supply, known power supplies can be used.

As described above, according to the magnetoresistance effect element in the case of using both "STT and SOT" of the present disclosure, the contribution rates of STT and SOT can be freely controlled by the amount of the currents supplied from the first power supply and the second power supply. For that reason, since the contribution rates of STT and SOT can be freely controlled in response to the performance required for the device, an element which can function as a more versatile magnetoresistance effect element can be obtained.

(Magnetization Reversal Method)

In the magnetization reversal method, the current density of the current flowing in the spin-orbit torque wiring of the magnetoresistance effect element of the present disclosure can be less than $1 \times 10^7 A/cm^2$.

When the current density of the current flowing in the spin-orbit torque wiring is too large, heat is generated by the current flowing in the spin-orbit torque wiring. When the heat is applied to the second ferromagnetic metal layer, the stability of the magnetization of the second ferromagnetic metal layer disappears and hence unexpected magnetization reversal or the like may occur. When such unexpected magnetization reversal occurs, a problem arises in that the recorded information is rewritten. That is, it is desirable to adjust the current density of the current flowing in the spin-orbit torque wiring so that the current density does not increase too much in order to avoid the unexpected magnetization reversal. When the current density of the current flowing in the spin-orbit torque wiring is less than $1 \times 10^7 A/cm^2$, it is possible to prevent the magnetization reversal caused by at least generated heat.

In the magnetization reversal method, when the magnetoresistance effect element of the present disclosure has a configuration of using "STT and SOT", a current may be applied to the power supply of the magnetoresistance effect element after a current is applied to the power supply of the spin-orbit torque wiring.

The SOT magnetization reversal step and the STT magnetization reversal step may be performed at the same time or the STT magnetization reversal step may be performed after the SOT magnetization reversal step is performed in advance. A current may be supplied from the first power supply and the second power supply at the same time or a current may be supplied from the first power supply after a current is supplied from the second power supply. However, it is desirable to apply a current to the power supply of the magnetoresistance effect element after applying a current to the power supply of the spin-orbit torque wiring in order to more certainly obtain the magnetization reversal assisting effect using SOT. That is, it is desirable to supply a current from the first power supply after supplying a current from the second power supply.

(Magnetic Memory)

The magnetic memory (MRAM) of the present disclosure includes a plurality of magnetoresistance effect elements of the present disclosure.

(Manufacturing Method)

The spin current magnetization reversal element can be obtained by using a film formation technique such as a sputtering method and a shape processing technique such as photolithography and Ar ion milling Hereinafter, a method of manufacturing the spin current magnetization reversal element will be described by describing a method of manufacturing the magnetoresistance effect element adopting the spin current magnetization reversal element.

First, a spin-orbit torque wiring is formed on a substrate corresponding to a support body. A film is formed from metal constituting the spin-orbit torque wiring by using binary simultaneous sputtering. As the adjustment of a composition ratio, various composition ratios can be realized by adjusting the applied DC voltage and adjusting the sputtering rate of each composition ratio. Next, the spin-orbit torque wiring is processed into a predetermined shape using a technique such as photolithography.

Then, portions other than the spin-orbit torque wiring are covered with an insulating film such as an oxide film. The exposed surfaces of the spin-orbit torque wiring and the insulating film are preferably polished by chemical mechanical polishing (CMP).

Next, a magnetoresistance effect element is manufactured. The magnetoresistance effect element can be manufactured by using known film forming methods such as sputtering. When the magnetoresistance effect element is a TMR element, for example, a tunnel barrier layer is formed by first sputtering magnesium, aluminum, and metal serving as a divalent cation of a plurality of non-magnetic elements on a first ferromagnetic metal layer to form a metal thin film having a thickness of about 0.4 to 2.0 nm, performing plasma oxidation or natural oxidation by oxygen introduction, and performing a subsequent heat treatment. Examples of the film formation method include a vapor deposition method, a laser ablation method, an MBE method, and the like in addition to the sputtering method.

It is desirable to perform an annealing treatment on the obtained laminated film. The layer formed by reactive sputtering is amorphous and needs to be crystallized. For example, when Co—Fe—B is used as the ferromagnetic metal layer, a part of B is crystallized by being annealed.

The magnetoresistance effect element manufactured by annealing improves the MR ratio as compared with the magnetoresistance effect element manufactured without an annealing treatment. It is considered that the uniformity of the crystal size and the orientation of the tunnel barrier layer of the non-magnetic layer are improved by the annealing treatment.

As the annealing treatment, it is desirable to perform heating for 1 hour or more and 10 hours or less at a temperature of 100° C. or more and 500° C. or less while applying a magnetic field of 2 kOe or more and 10 kOe or less after performing heating for 5 minutes or more and 100 minutes or less at a temperature of 300° C. or more and 500° C. or less in an inert atmosphere such as Ar.

As a method for forming the magnetoresistance effect element into a predetermined shape, processing means such as photolithography or the like can be used. First, the magnetoresistance effect element is laminated and then a resist is applied to the surface of the magnetoresistance effect element opposite to the spin-orbit torque wiring. Then, a predetermined portion of the resist is cured, and the unnecessary portion of the resist is removed. A portion where the resist is cured becomes a protective film of the magnetoresistance effect element. The shape of the portion where the resist is cured matches the shape of the finally obtained magnetoresistance effect element.

Then, processing such as ion milling and reactive ion etching (RIE) is performed on the surface on which the protective film has been formed. A portion where the protective film is not formed is removed and thus a magnetoresistance effect element having a predetermined shape is obtained.

The present disclosure is not limited to the configuration and the manufacturing method of the spin current magnetization reversal element according to the aforementioned embodiment, and various modifications can be made without departing from the spirit of the present disclosure.

For example, in the above-described embodiment, a so-called top pin structure of the magnetoresistance effect element has been an exemplary example in which the first ferromagnetic metal layer laminated later and disposed close to the substrate is formed as a free magnetization layer and the second ferromagnetic metal layer laminated first and disposed far from the substrate is a magnetization fixed layer (pin layer), but the structure of the magnetoresistance effect element is not particularly limited. For example, a so-called bottom pin structure may be employed.

(Reversal Current Density Measurement Method)

A DC power supply and a DC voltmeter are provided at both ends of the spin-orbit torque wiring. The element resistance of the magnetoresistance effect element can be measured by a four terminal method using the DC power supply, the DC voltmeter, the upper electrode and the lower electrode which is the spin-orbit torque wiring.

A pulse current is applied to the spin-orbit torque wiring and magnetoresistance is measured after the application. The pulse width to be used is set to, for example, 0.5 seconds.

Further, an external magnetic field is applied in the extension direction of the spin-orbit torque wiring. The magnitude of the external magnetic field is set to, for example, 1000 Oe (100 mT).

In the embodiment to be described below, the reversal current density was defined as the average of the absolute value of the reversal current density from the parallel state to the antiparallel state and the reversal current density from the antiparallel state to the parallel state.

(Method of Determining Crystal Structure)

The crystal structure can be determined by thin film X-ray diffraction (XRD). As the XRD, out-of-plane XRD and in-plane XRD were performed.

At the same time, the atomic arrangement may be directly checked by using a transmission electron microscope (TEM).

(Method of Identifying Composition Ratio of Spin-orbit Torque Wiring Material)

By using X-ray fluorescence analysis (XRF), the composition ratio of the spin-orbit torque wiring material can be identified.

EXAMPLES (Determination of Crystal Structure)

In Examples 1 to 11, the crystal structure of the material constituting the spin-orbit torque wiring was determined as follows.

A film structure of a sample for determining the crystal structure was a thermally oxidized Si substrate/Ta (5 nm)/spin-orbit torque wiring material (20 nm)/Ta (10 nm) and was manufactured as follows.

A Ta film was formed as a base layer on a thermally oxidized Si substrate to a thickness of 5 nm, and then a spin-orbit torque wiring material film was formed to a thickness of 20 nm on the Ta film by using a DC/RF magnetron sputtering device capable of performing simultaneous binary sputtering. The composition ratio was adjusted by changing the applied DC voltage and adjusting the sputtering rate. The nitride films of Examples 9 to 11 were formed by allowing a pure nitrogen gas to flow into a sputtering chamber in addition to Ar gas after preparing a mass flow controller and a gas line different from an Ar gas line. Next, the Ta film having a thickness of 10 nm was formed on the spin-orbit torque wiring material film to manufacture a sample.

Next, the crystal structure was determined for each obtained sample using thin film X-ray diffraction (out-of-plane XRD and in-plane XRD). The results are shown in Table 1 and Table 2.

(Identification of Composition Ratio of Spin-orbit Torque Wiring Material)

In Examples 1 to 11, the composition ratio of the constituent material of the spin-orbit torque wiring was identified by X-ray fluorescence analysis (XRF).

A film structure of a sample for identifying the composition ratio of the spin-orbit torque wiring material was thermally oxidized Si substrate/spin-orbit torque wiring material (100 nm), and was manufactured as follows.

A spin-orbit torque wiring material film was formed to a thickness of 100 nm by using a DC/RF magnetron sputtering device capable of performing binary simultaneous sputtering on a thermally oxidized Si substrate. The composition ratio was adjusted by changing the applied DC voltage and adjusting each sputtering rate. The results are shown in Table 1 and Table 2.

(Measurement of Reversal Current Density)

The reversal current density of each of the magnetoresistance effect elements of Examples 1 to 11 and Comparative Examples 1 to 8 was measured while applying an external magnetic field of 1000 Oe (100 mT) in the extension direction of the spin-orbit torque wiring. The reversal current density is obtained by dividing the current obtained when the resistance value of the magnetoresistance effect element changes by the cross-sectional area of the cross-section of the spin-orbit torque wiring, wherein the cross-section is orthogonal to the longitudinal direction of the spin-orbit torque wiring. The reversal current density shown in Table 1 and Table 2 is the average of the absolute value of the reversal current density when the magnetization changes from the parallel state to the antiparallel state and the reversal current density when the magnetization changes from the antiparallel state to the parallel state.

The reversal current flowed while a DC power supply was connected to both ends of the spin-orbit torque wiring. The current was a pulse current having a pulse width of 0.5 seconds. The current amount was measured by a DC ammeter connected to both ends of the spin-orbit torque wiring. A change in resistance value of the magnetoresistance effect element was measured by a four terminal method in a state where the spin-orbit torque wiring of the magnetoresistance effect element was set to a lower electrode and an upper electrode was provided at the opposite side to the spin-orbit torque wiring. A DC current supply and a DC voltmeter were connected between the upper and lower electrodes.

A film configuration of each of the magnetoresistance effect element samples (Examples 1 to 11) for measuring the reversal current was a thermally oxidized Si substrate/Ta (5 nm)/spin-orbit torque wiring material (10 nm)/Fe (0.9 nm)/MgO (1.6 nm)/CoFeB (1.6 nm)/Ru (3 nm)/Ta (5 nm) and was manufactured as follows.

A Ta film was formed as a base layer on a thermally oxidized Si substrate to a thickness of 5 nm and then a spin-orbit torque wiring material film was formed to a thickness of 10 nm by using a DC/RF magnetron sputtering device capable of performing simultaneous binary sputtering on the Ta film. The composition ratio was adjusted by changing the applied DC voltage and adjusting the sputtering rate. The nitride films of Examples 9 to 11 were formed by allowing a pure nitrogen gas to flow into a sputtering chamber in addition to Ar gas after preparing a mass flow controller and a gas line different from an Ar gas line. Next, the formed film was processed into a rectangular shape in the plan view to have a width of 200 nm and a length of 1000 nm by photolithography to form the spin-orbit torque wiring. A $SiO_2$ film was formed as an insulating film on a portion removed by photolithography and a flat surface was manufactured by CMP-polishing the spin-orbit torque wiring and the insulating film.

Next, a Fe film corresponding to the first ferromagnetic metal layer (the magnetization free layer) of 0.9 nm, a MgO film corresponding to the tunnel barrier layer of 1.6 nm, a CoFeB film corresponding to the second ferromagnetic metal layer (the magnetization fixed layer) of 1.3 nm, and a Ru film of 3 nm and a Ta film of 5 nm corresponding to the cap layer were sequentially formed on the spin-orbit torque wiring. Then, a columnar magnetoresistance effect element having a diameter of 100 nm was manufactured by using photolithography and Ar ion milling In addition, the film was cut out to the Fe film corresponding to the first ferromagnetic metal layer by the Ar ion milling. The film thickness of the ferromagnetic metal layer (Fe and CoFeB films) is a film thickness in which a vertical magnetization occurs.

Further, since the magnetoresistance effect element samples (Comparative Examples 1 to 8) for measuring the reversal current were different from those of Examples 1 to 11 in that the spin-orbit torque wiring material was single metal instead of any one of alloy, metal carbide, and metal nitride, the other structures were manufactured in the same order as those of Examples 1 to 11.

The measurement result of the reversal current density for the magnetoresistance effect elements of Examples 1 to 11 and Comparative Examples 1 to 8 obtained as described above is shown in Table 1 and Table 2.

TABLE 1

| | MATERIAL | SPACE GROUP | STRUCTURE | FIRST FERROMAGNETIC METAL LAYER | SOT REVERSAL CURRENT DENSITY [A/cm$^2$] |
|---|---|---|---|---|---|
| EXAMPLE 1 | $Al_{0.5}Ni_{0.5}$ | Pm-3m | CsCl | Fe | $5.5 \times 10^6$ |
| EXAMPLE 2 | $Al_{0.5}Ru_{0.5}$ | Pm-3m | CsCl | Fe | $6.4 \times 10^6$ |
| EXAMPLE 3 | $Al_{0.5}Rh_{0.5}$ | Pm-3m | CsCl | Fe | $6.2 \times 10^6$ |
| EXAMPLE 4 | $Ti_{0.5}Ni_{0.5}$ | Pm-3m | CsCl | Fe | $7.2 \times 10^6$ |
| EXAMPLE 5 | $Pt_{0.75}Al_{0.25}$ | Pm-3m | $Cu_3Au$ | Fe | $4.2 \times 10^6$ |

TABLE 1-continued

| MATERIAL | SPACE GROUP | STRUCTURE | FIRST FERROMAGNETIC METAL LAYER | SOT REVERSAL CURRENT DENSITY [A/cm$^2$] |
|---|---|---|---|---|
| EXAMPLE 6 | $Ti_{0.67}Ni_{0.33}$ | Fd-3m | $Ti_2Ni$ | Fe | $6.6 \times 10^6$ |
| COMPARATIVE EXAMPLE 1 | Al | Fm-3m | | Fe | $>10^9$ (IMPOSSIBLE REVERSAL) |
| COMPARATIVE EXAMPLE 2 | Ni | Fm-3m | | Fe | $3.8 \times 10^8$ |
| COMPARATIVE EXAMPLE 3 | Ru | F63/mmc | | Fe | $3.8 \times 10^8$ |
| COMPARATIVE EXAMPLE 4 | Rh | Fm-3m | | Fe | $4.3 \times 10^8$ |
| COMPARATIVE EXAMPLE 5 | Ti | F63/mmc | | Fe | $>10^9$ (IMPOSSIBLE REVERSAL) |
| COMPARATIVE EXAMPLE 6 | Pt | Fm-3m | | Fe | $2.1 \times 10^8$ |

TABLE 2

| | MATERIAL | SPACE GROUP | STRUCTURE | FIRST FERROMAGNETIC METAL LAYER | SOT REVERSAL CURRENT DENSITY [A/cm$^2$] |
|---|---|---|---|---|---|
| EXAMPLE 7 | $Al_{0.67}Au_{0.33}$ | Fm-3m | $CaF_2$ | Fe | $5.1 \times 10^6$ |
| EXAMPLE 8 | $Si_{0.25}Mn_{0.75}$ | Fm-3m | $BiF_3$ | Fe | $6.9 \times 10^6$ |
| EXAMPLE 9 | AlN | Fm-3m | NaCl | Fe | $8.2 \times 10^6$ |
| EXAMPLE 10 | TaN | Fm-3m | NaCl | Fe | $3.1 \times 10^6$ |
| EXAMPLE 11 | TiN | Fm-3m | NaCl | Fe | $6.6 \times 10^6$ |
| COMPARATIVE EXAMPLE 7 | Au | Fm-3m | | Fe | $2.8 \times 10^8$ |
| COMPARATIVE EXAMPLE 8 | Si | Fd-3m | | Fe | $>10^9$ (IMPOSSIBLE REVERSAL) |

As shown in Table 1 and Table 2, in Examples 1 to 11 corresponding to the magnetoresistance effect element including the spin-orbit torque wiring formed of a material having a predetermined composition and a cubic structure with symmetry of a space group Pm-3 in, Fd-3 m or Fm-3 m, the reversal current density was smaller than Comparative Examples 1 to 8 corresponding to the magnetoresistance effect element with the spin-orbit torque wiring formed of single metal. That is, the reversal current density was on the order of 10$^8$ A/cm$^2$ in Comparative Examples 1 to 8, but was on the order of 10$^6$ A/cm$^2$ in Examples 1 to 11. As described above, since the spin-orbit torque wiring was set to be a predetermined material, the magnetization of the first ferromagnetic metal layer was easily reversed.

The concentration ranges of the alloys having the crystal structures shown in Table 1 and Table 2 are as follows.

$Al_xNi_{1-x}$ (Example 1): $0.42 \leq X \leq 0.54$
$Al_xRu_{1-x}$ (Example 2): $0.48 \leq X \leq 0.51$
$Al_xRh_{1-x}$ (Example 3): $0.48 \leq X \leq 0.58$
$Ti_xNi_{1-x}$ (Example 4): $0.47 \leq X \leq 0.50$
$Pt_xAl_{1-x}$ (Example 5): $0.72 \leq X \leq 0.80$
$Ti_xNi_{1-x}$ (Example 6): $0.50 \leq X \leq 0.67$
$Al_xAu_{1-x}$ (Example 7): $0.50 \leq X \leq 0.67$
$Si_xMn_{1-x}$ (Example 8): $0.22 \leq X \leq 0.25$

REFERENCE SIGNS LIST

1 First ferromagnetic metal layer
2 Spin-orbit torque wiring
100 Magnetoresistance effect element
101 First ferromagnetic metal layer
102 Non-magnetic layer
103 Second ferromagnetic metal layer
105 Magnetoresistance effect element portion

The invention claimed is:

1. A spin current magnetization reversal element comprising:
a first ferromagnetic metal layer with a changeable magnetization direction; and
a spin-orbit torque wiring that is bonded to the first ferromagnetic metal layer, and extends in a second direction intersecting a first direction, the first direction being perpendicular to a surface of the first ferromagnetic metal layer, and the spin-orbit torque wiring being configured to change a magnetization direction of the first ferromagnetic metal layer,
wherein:
a material of the spin-orbit torque wiring is a binary alloy represented by the formula $A_xB_{1-x}$:
A is an element selected from a group consisting of Al, Ti, and Pt; B is an element selected from a group consisting of Al, Cr, Mn, Fe, Co, Ni, Y, Ru, Rh, and Ir and the material has a cubic structure with symmetry of a space group Pm-3m or Fd-3m; or
A is an element selected from a group consisting of Al, Si, Ti, Y, and Ta; B is an element selected from a group consisting of C, N, Co, Pt, Au, and Bi and the material has a cubic structure with symmetry of a space group Fm-3m.

2. The spin current magnetization reversal element according to claim 1, wherein the material has a CsCl crystal structure, and is selected from a group consisting of $Al_xFe_{1-x}$, $Al_xCo_{1-x}$, $Al_xNi_{1-x}$, $Al_xRu_{1-x}$, $Al_xRh_{1-x}$, $Al_xIr_{1-x}$, $Ti_xFe_{1-x}$, $Ti_xCo_{1-x}$, and $Ti_xNi_{1-x}$.

3. The spin current magnetization reversal element according to claim 1,
wherein the material has a $Ti_2Ni$ crystal structure, and is selected from a group consisting of $Ti_xFe_{1-x}$, $Ti_xCo_{1-x}$, and $Ti_xNi_{1-x}$.

4. The spin current magnetization reversal element according to claim 1,
wherein the material has a $Cu_3Au$ crystal structure, and is selected from a group consisting of $Pt_xAl_{1-x}$, $Pt_xCr_{1-x}$, $Pt_xMn_{1-x}$, $Pt_xFe_{1-x}$, and $Pt_xY_{1-x}$.

5. The spin current magnetization reversal element according to claim 1,
wherein the material has a NaCl crystal structure, and is selected from a group consisting of $Al_xN_{1-x}$, $Ti_xC_{1-x}$, $Ti_xN_{1-x}$, $Y_xBi_{1-x}$, and $Ta_xN_{1-x}$.

6. The spin current magnetization reversal element according to claim 1,
wherein the material has a $BiF_3$ crystal structure, and is selected from a group consisting of $Al_xFe_{1-x}$, $Si_xMn_{1-x}$, and $Si_xFe_{1-x}$.

7. The spin current magnetization reversal element according to claim 1,
wherein the material has a $CaF_2$ crystal structure, and is selected from a group consisting of $Al_xPt_{1-x}$, $Al_xAu_{1-x}$, and $Al_xCo_{1-x}$.

8. The spin current magnetization reversal element according to claim 1, further comprising:
a cap layer formed on the surface of the first ferromagnetic metal layer on a side where the spin-orbit torque wiring is provided, such that the cap layer is provided between the first ferromagnetic metal layer and the spin-orbit torque wiring.

9. The spin current magnetization reversal element according to claim 1, further comprising:
a cap layer formed on the surface of the first ferromagnetic metal layer on a side where the spin-orbit torque wiring is provided, such that the cap layer is provided between the first ferromagnetic metal layer and the spin-orbit torque wiring,
wherein the cap layer is formed of any one selected from a group consisting of Ru, Ta, Cu, Ag, Au, Mg, and Al.

10. The spin current magnetization reversal element according to claim 1, further comprising:
a cap layer formed on the surface of the first ferromagnetic metal layer on a side where the spin-orbit torque wiring is provided, such that the cap layer is provided between the first ferromagnetic metal layer and the spin-orbit torque wiring,
wherein the cap layer has a crystal structure selected from a fcc crystal structure, a hcp crystal structure, and a bcc crystal structure.

11. The spin current magnetization reversal element according to claim 1, wherein the first ferromagnetic metal layer consists of Fe.

12. The spin current magnetization reversal element according to claim 1, wherein the material of the spin-orbit torque wiring has a crystal structure selected from the group consisting of a CsCl crystal structure, a $Ti_2Ni$ crystal structure, a $Cu_3Au$ crystal structure, a NaCl crystal structure, a $BiF_3$ crystal structure, and a $CaF_2$ crystal structure.

13. The spin current magnetization reversal element according to claim 1, wherein the first ferromagnetic metal layer consists of a material selected from:
a metal selected from Cr, Mn, Co, Fe, and Ni;
an alloy containing at least one of Cr, Mn, Co, Fe, and Ni;
an alloy containing at least one of Cr, Mn, Co, Fe, and Ni and at least one of B, C, and N; and
an alloy selected from Co—Fe, Co—Fe—B and Ni—Fe.

14. A magnetoresistance effect element comprising:
a first ferromagnetic metal layer with a changeable magnetization direction;
a second ferromagnetic metal layer with a fixed magnetization direction;
a non-magnetic layer which is sandwiched between the first ferromagnetic metal layer and the second ferromagnetic metal layer; and
a spin-orbit torque wiring that is bonded to the first ferromagnetic metal layer, and extends in a second direction intersecting a first direction, the first direction being perpendicular to a surface of the first ferromagnetic metal layer, and the spin-orbit torque wiring being configured to change a magnetization direction of the first ferromagnetic metal layer,
wherein:
a material of the spin-orbit torque wiring is a binary alloy represented by the formula $A_xB_{1-x}$:
A is an element selected from a group consisting of Al, Ti, and Pt; B is an element selected from a group consisting of Al, Cr, Mn, Fe, Co, Ni, Y, Ru, Rh, and Ir and the material has a cubic structure with symmetry of a space group Pm-3m or Fd-3m; or
A is an element selected from a group consisting of Al, Si, Ti, Y, and Ta; B is an element selected from a group consisting of C, N, Co, Pt, Au, and Bi and the material has a cubic structure with symmetry of a space group Fm-3m.

15. A magnetic memory comprising:
a plurality of the magnetoresistance effect elements according to claim 14.

16. The magnetoresistance effect element according to claim 14, wherein:
the material of the spin-orbit torque wiring is the binary alloy, and is at least one selected from (i) to (iv):
(i) a material having a CsCl crystal structure and selected from a group consisting of $Al_xFe_{1-x}$, $Al_xCo_{1-x}$, $Al_xNi_{1-x}$, $Al_xRu_{1-x}$, $Al_xRh_{1-x}$, $Al_xIr_{1-x}$, $Ti_xFe_{1-x}$, $Ti_xCo_{1-x}$, and $Ti_xNi_{1-x}$,
(ii) a material having a $Ti_2Ni$ crystal structure and selected from a group consisting of $Ti_xFe_{1-x}$, $Ti_xCo_{1-x}$, and $Ti_xNi_{1-x}$,
(iii) a material having a $Cu_3Au$ crystal structure and selected from a group consisting of $Pt_xAl_{1-x}$, $Pt_xCr_{1-x}$, $Pt_xMn_{1-x}$, $Pt_xFe_{1-x}$, and $Pt_xY_{1-x}$,
(iv) a material having a NaCl crystal structure and selected from a group consisting of $Al_xN_{1-x}$, $Ti_xC_{1-x}$, $Ti_xN_{1-x}$, $Y_xBi_{1-x}$, and $Ta_xN_{1-x}$,
(v) a material having a $BiF_3$ crystal structure and selected from a group consisting of $Al_xFe_{1-x}$, $Si_xMn_{1-x}$, and $Si_xFe_{1-x}$, and
(vi) a material having a $CaF_2$ crystal structure and selected from a group consisting of $Al_xPt_{1-x}$, $Al_xAu_{1-x}$, and $Al_xCo_{1-x}$.

17. The magnetoresistance effect element according to claim 14, wherein the first ferromagnetic metal layer consists of Fe.

18. The magnetoresistance effect element according to claim 14, wherein the second ferromagnetic metal layer, the non-magnetic layer, the first ferromagnetic metal layer, and the spin-orbit torque wiring are present in this order.

19. The magnetoresistance effect element according to claim 14, wherein the first ferromagnetic metal layer is a free magnetization layer, and the second ferromagnetic metal layer is a magnetization fixed layer.

20. The magnetoresistance effect element according to claim 14, wherein:
- the second ferromagnetic metal layer consists of a material selected from:
  - a metal selected from Cr, Mn, Co, Fe, and Ni;
  - an alloy containing at least one of Cr, Mn, Co, Fe, and Ni;
  - an alloy containing at least one of Cr, Mn, Co, Fe, and Ni and at least one of B, C, and N;
  - an alloy selected from Co—Fe and Co—Fe—B; and
  - an alloy selected from $Co_2FeSi$, $Co_2MnSi$, and $Co_2Mn_{1-a}Fe_aAl_bSi_{1-b}$, and
- the non-magnetic layer consists of a material selected from:
  - an alloy selected from $Al_2O_3$, $SiO_2$, MgO, and $MgAl_2O_4$;
  - a metal selected from Al, Si, and Mg in which a part of the Al, Si, or Mg is substituted by Zn or Be; or
  - a metal selected Cu, Au, and Ag.

* * * * *